(12) United States Patent
Takahashi et al.

(10) Patent No.: US 7,217,140 B2
(45) Date of Patent: May 15, 2007

(54) CONTACT ASSEMBLY AND SOCKET FOR USE WITH SEMICONDUCTOR PACKAGES

(75) Inventors: Hideyuki Takahashi, Shizuoka (JP); Kiyokazu Ikeya, Shizuoka (JP)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 11/326,302

(22) Filed: Jan. 5, 2006

(65) Prior Publication Data

US 2006/0192264 A1    Aug. 31, 2006

(30) Foreign Application Priority Data

Feb. 28, 2005   (JP)   ............... 2005-053963

(51) Int. Cl.
*H01R 12/00* (2006.01)
(52) U.S. Cl. ...................................... 439/71
(58) Field of Classification Search ................ 439/71, 439/70, 266, 701
See application file for complete search history.

(56) References Cited

U.S. PATENT DOCUMENTS 5,844,418 A * 12/1998 Wood et al. ................ 324/755
6,575,767 B2 * 6/2003 Satoh et al. ................. 439/71
6,709,279 B2 * 3/2004 Uratsuji ..................... 439/71
6,749,443 B2   6/2004 Sano et al.

FOREIGN PATENT DOCUMENTS

JP        2004-152554       5/2004
JP        3566691           6/2004

* cited by examiner

*Primary Examiner*—Phuong Dinh
(74) *Attorney, Agent, or Firm*—Russell E. Baumann

(57) ABSTRACT

In a contact assembly, a first set of contacts (30-1 through 30-5) is arranged on a first surface and a second set of contacts (40-5 through 4-1) is arranged on a second surface with respective contacts of each set used as pairs. A plurality of first and second sets are stacked one on top of another separated by insulators, the first terminal portions (12) of respective first and the second sets of contacts are aligned in the direction of stacking and the second terminal portions (20) of the first and second sets of contacts are arranged in such a fashion as to be symmetrical relative to a median line. The pitch (P2) of the second terminal portions (20) of the first and the second sets of contacts is expanded to a greater degree than the pitch (P1) of the first terminal portions (12) in two preferred embodiments. The pitch of the second terminal portions of a contact assembly (200) having two first and two second sets of contacts is also shown expanded in the stacking direction in one embodiment forming a zigzag pattern of the second terminal portions.

19 Claims, 8 Drawing Sheets

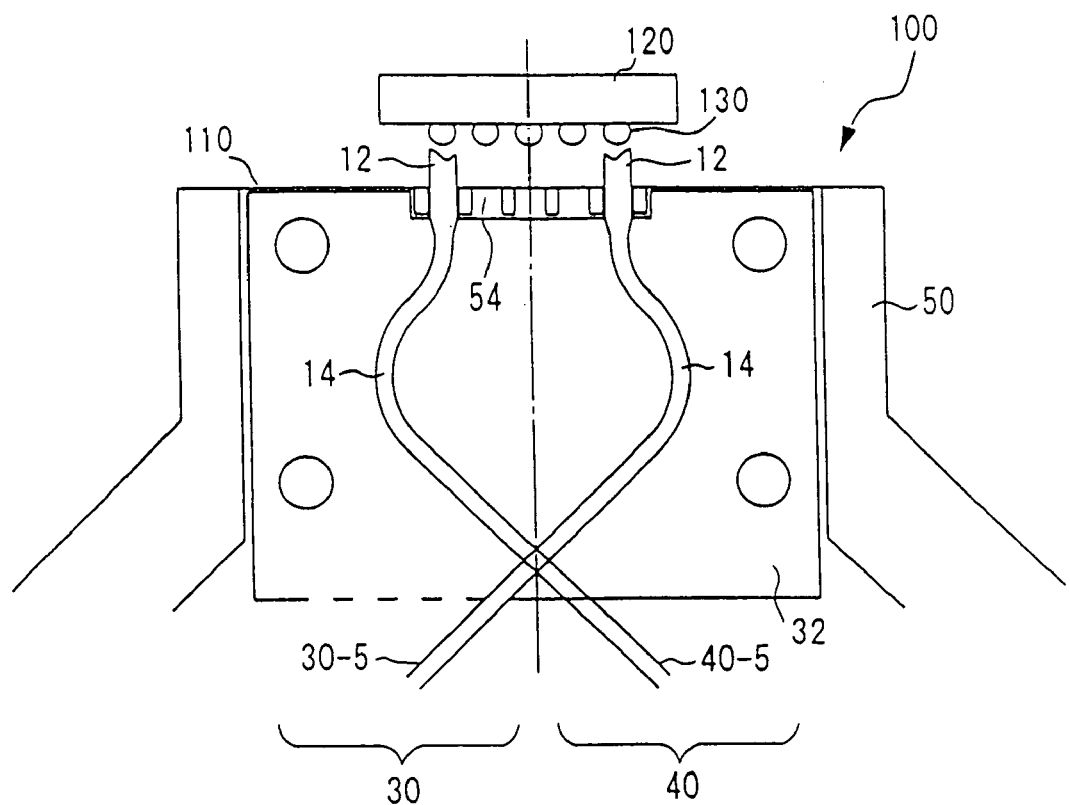
Fig. 4(a)
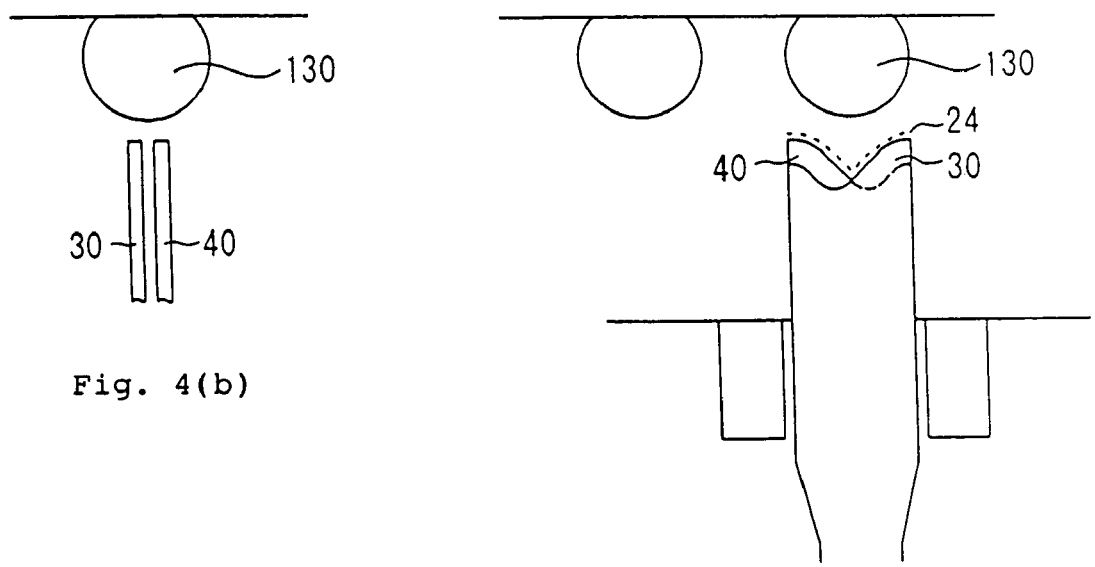
Fig. 4(b)
Fig. 4(c)

CONTACT ASSEMBLY AND SOCKET FOR USE WITH SEMICONDUCTOR PACKAGES

CROSS REFERENCE TO RELATED APPLICATIONS

Priority is claimed under 35 USC Section 119 of Japanese Patent Application No. 2005-053963, filed Feb. 28, 2005.

FIELD OF THE INVENTION

This invention relates generally to a contact assembly used for a socket for semiconductor packages and more particularly to a contact assembly used for semiconductor packages having narrow pitch terminals, such as BGA, LGA and CSP packages.

BACKGROUND OF THE INVENTION

As the size of BGA or LGA packages is reduced, the space occupied by the terminals is also reduced, making it necessary to decrease the pitch of the terminals. In conformity with this, contacts that are mounted in the sockets are arranged corresponding to the pitch of the terminals. U.S. Pat. No. 6,749,443 relates to a socket for mounting a semiconductor device of the surface mounting type such as BGA and CSP devices. A socket capable of adjusting the amount of deformation of the terminals is provided pursuant to this patent by providing contact restraining members for limiting the position of the end of the contacts.

Japanese Patent Application No. 2004-152554 shows a socket in which potential dislocation of the BGA package is prevented when the terminals are pulled away from the end of the contacts by positioning and holding the BGA package that has been placed in the direction of the diagonal line by means of a positioning mechanism that is linked to the movement of the cover member.

When the pitch of the terminals of a BGA or LGA package becomes narrower, the contacts are arranged at a pitch corresponding thereto, with a consequence that the contact area between each terminal and the respective contact becomes smaller and this develops a tendency for contact resistance to become greater. In the case where the terminals are solder balls of a bump shape, as in the case of a BGA package, the shape of the tip of the contacts is made like a V or a U as shown in FIG. 9 for the purpose of preventing any deformation of the lowermost surface of the solder balls, with a result that the contact resistance becomes greater.

An increase in contact resistance greatly affects the measurement accuracy when the semiconductor device is tested, leading to an increase in errors. This problem can be dealt with by using a Kelvin technique in which separate contacts are used for the supply of electric power and for the measurement of the signal. Accordingly, using this technique, the number of contacts required is doubled. However, doubling the contacts of a prior art structure as shown in FIG. 9, is not feasible for use with such narrow-pitch semiconductor packages. Further, if the number of contacts is doubled and the pitch of the contacts is concomitantly narrowed, it becomes difficult to form through-holes in the substrate for connection of the contacts that protrude from the socket.

SUMMARY OF THE INVENTION

An object of the present invention is the provision of a contact assembly and socket that overcomes the problems as described above. That is, providing a contact assembly and socket capable of handling narrow-pitch terminals of the semiconductor package.

Moreover, an object of this invention is the provision of a contact assembly that is capable of effecting a Kelvin technique connection with the terminals of the semiconductor package and a socket capable of accurately testing the semiconductor packages.

A contact assembly made according to a preferred embodiment of the invention comprises a plurality of stacked contacts, in which a first sub-assembly or set of contacts is arranged according to a first pattern on a first surface and a second sub-assembly or set of contacts is arranged according to a second pattern on a second surface, each contact of the first set forming a pair with a respective contact of the second set and the first ends of each pair of the first and second sets of contacts being arranged in the direction of stacking. The second ends of the first set of contacts are arranged along a first range on one side of a median line, the second ends of the second set of contacts are arranged along a second range on the opposite side of the median line and the pitch of the second ends of the first and second sets of contacts in the direction along the respective ranges is either greater than or equal to the pitch of the first ends of the first and second sets of contacts in the direction along the range.

Preferably, the second set of contacts is disposed at positions 180 degrees relative to the first set of contacts. In other words, the contacts are in a relationship in which they are turned over from right to left directions. In a second preferred embodiment, the second ends of two stacked first sets and two stacked second sets of contacts are arranged in a zigzag relation in the stacking direction.

Preferably, an insulator is interposed between the first set of contacts and the second set of contacts. It is desirable that the insulator be generally planar, such as an insulator sheet or an insulator plate that facilitates the establishment of a selected pitch in the stacking direction of the first terminal portions of the second set. Desirably, the first terminal portion of the first set and of the second set of contacts are connected to the respective terminals of the semiconductor package using a Kelvin technique.

Preferably, the contact assembly includes a plurality of separators, each separator serving to position and accommodate a first and second set of contacts, with the separators, in turn, being stacked, one against another.

An individual contact comprises an elongated member extending generally in a vertical or Y direction and has a first terminal portion, a first elastically deformable portion having a curved section connected to the first terminal portion, an intermediate portion connected to the first elastically deformable portion that has been offset in the horizontal or X direction from the first terminal portion and a second terminal portion connected to the intermediate portion that is further offset in the X direction from the intermediate portion. Desirably, a mounting part is formed at the intermediate portion of the contact, the mounting part being engaged to a protruding part formed on the separator.

Desirably, the free end of the first terminal portion has a groove generally in the shape of a V or a U having first and second sloped surfaces that oppose each other in the groove. One slope extends to its nadir beyond the center line of the elongated member. In addition, one slope extends in the direction in which the curved section of the first elastically deformable portion is curved and one of the free ends of the slopes extends further in the Y or axial direction than the other slope.

A second elastically deformable portion may be formed between the intermediate portion of each contact and the second terminal portion to facilitate forming a compression type mounting arrangement, if desired, as shown in FIGS. 8(b) and 8(c).

A socket made according to the invention includes a contact assembly which has the features described above. The second terminal portions of the contact assembly protrude from the base of the socket, and the second terminal portions are electrically connectable to a substrate. More preferably, a Kelvin technique connection is utilized by using the first set of contacts for the supply of electric power and the second set of contacts for the measurement of signals.

According to the contact assembly of the invention, the first and second sets of contacts have different arrangement patterns with the second terminal portions of the second set spaced in the X direction on one side of a median line and the second terminal portions of the first set spaced in the X direction on the other side of the median line and with the first and second sets of contacts being stacked one over the other. Thus, it becomes possible to cope with the narrow pitch of the semiconductor packages. By stacking together the first and second sets of contacts, it becomes possible to connect the first terminal portions to the terminals of the semiconductor package using a Kelvin technique.

In addition, the second terminal portions of the contacts in certain preferred embodiments have an expanded pitch relative to the pitch of the first terminal portions, with a result that it becomes easier to form through-holes in the substrate that receive the second terminal portions.

The contact assembly made according to the invention can be suitably used, for example, in a burn-in test socket employed in a heating test (burn-in test) of a BGA package. This will be explained in detail below by referring to the attached drawings.

BRIEF DESCRIPTION OF THE DRAWINGS

Other objects, advantages and details of the invention appear in the following detailed description of the preferred embodiments, the detailed description referring to the drawings in which like reference characters refer to like components or structural features throughout the several views of the drawings.

FIG. 4(a) is a schematic front elevational view of a separator to facilitate the explanation of the operation when contacts engage respective solder balls by representative contacts of the first and second sets of contacts; FIG. 4(b) is an enlarged side view of a portion of FIG. 4(a) showing the relationship between the solder ball and the first terminal portions of the contacts and FIG. 4(c) is an enlarged view of solder balls and of the first terminal portions of a pair of the first and second sets of contacts;

DETAILED DESCRIPTION OF PREFERRED EMBODIMENTS

Figure 1:
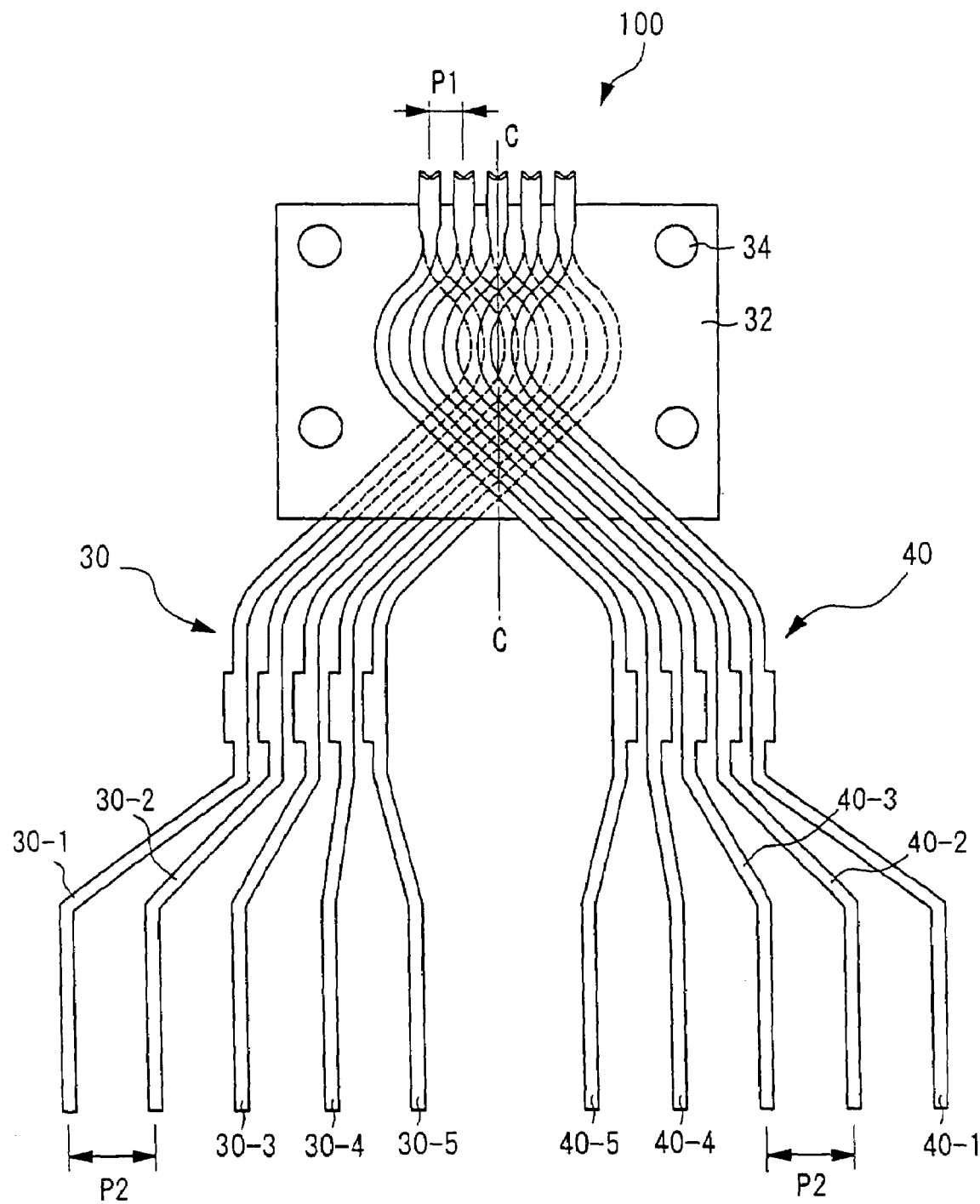
FIG. 1 is a plan view showing a contact assembly made according to a first preferred embodiment of the invention.

References made herein to certain orientations, such as horizontal, X direction, Y axis, etc., are made with respect to the orientation shown in the drawings.

FIG. 1 shows a contact assembly made according to a first preferred embodiment of the invention. Contact assembly 100 comprises two sets of contacts stacked together, one over the other. The first set of contacts 30 comprises contacts 30-1, 30-2, 30-3, 30-4 and 30-5 and are arranged on a first generally planar surface, for example, one face surface of an insulating sheet 32. Contacts 30-1 through 30-5 all face in the same direction and are spaced from one another in an X direction, i.e., approximately horizontally.

Above the first set of contacts, the second set of contacts are arranged on a second parallel, generally planar surface, such as the opposite face surface of sheet 32 interposed between the sets.

The second set of contacts comprises contacts 40-1, 40-2, 40-3, 40-4 and 40-5 which have been arranged spaced from one another in an X direction, i.e., approximately horizontally, but in a direction that is opposite to the layout of contacts 30-1 through 30-5, that is, in a direction flipped over relating to contacts 30-1 through 30-5 by 180 degrees.

The first set 30's and second set 40's of contacts are made of suitable conductive material such as beryllium or copper. They may be suitably formed by stamping or etching a metal plate.

Figures 2, 2A:
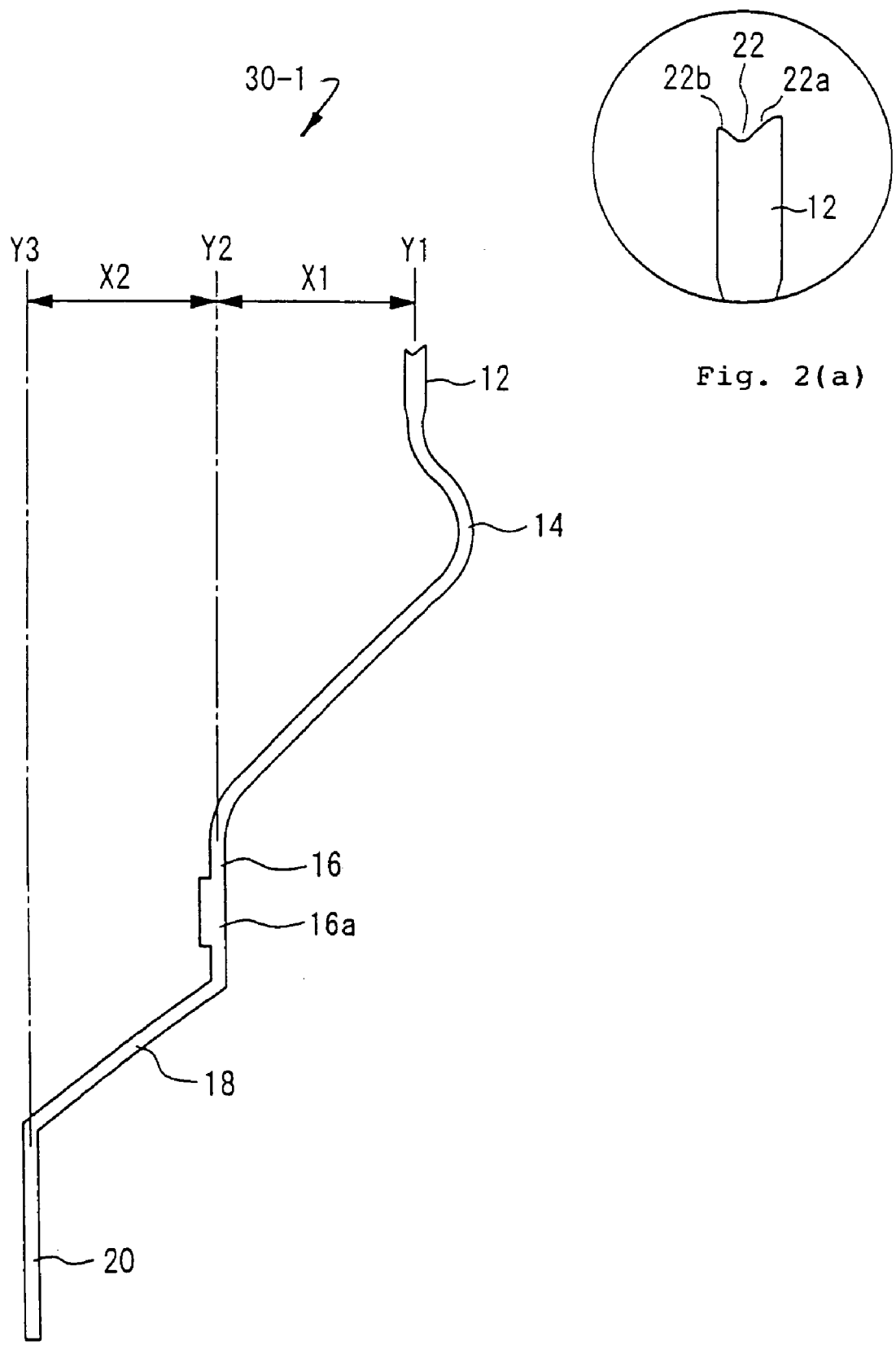
FIG. 2 is a plan view showing a single contact that is used in the FIG. 1 contact assembly and FIG. 2(a) is an enlarged, broken away portion of FIG. 2.

FIG. 2 shows a plan view of one of the contacts used in a contact assembly. The contact shown in the figure is contact 30-1, one of the contacts in the first set shown in FIG. 1. A typical form of construction of contact 30-1 comprises a first terminal portion 12 that engages a respective solder ball of a BGA, an elastically deformable portion 14 that extends from terminal portion 12 and has a curved shape followed by a sloped or inclined section, a generally straight line intermediate portion 16 that extends from the elastically deformable portion 14, a sloped portion 18 that inclines in an oblique direction from the intermediate portion 16 and a second terminal or portion 20 which extends from the sloped portion 18.

As best seen in FIG. 2(a), first terminal portion 12 has a groove 22 formed in the shape of a V or a U. Groove 22 is formed by opposing slopes 22a, 22b. Slope 22a is longer than slope 22b with the free end of slope 22a extending beyond the free end of slope 22b in the direction of the longitudinal axis of terminal portion 12. It will be noted that the nadir location of groove 22 is not centered between the free ends of the slopes and that slope 22a is formed on the same side of contact 30-1 as the direction in which the bend in deformable portion 14 extends.

Groove 22 is non-symmetrical with slope 22a extending further than slope 22b so that when the contact 12 is brought into engagement with a solder ball of the BGA package, it will help to prevent any possible loss of engagement as will be described below.

In addition, a non-engagement portion is formed at the lower portion of groove 22 serving to prevent possible deformation of the lowermost point of the solder ball.

The elastically deformable portion 14 is curved in the shape of an arc. When terminal portion 12 receives a load in the axial direction Y1, terminal portion 12 bends in such a fashion as to rotate on the side of the arc. Intermediate portion 16 of the contact is located at a position which is offset from terminal portion 12. In other words, the axial position Y2 of the intermediate portion 16 is displaced by a prescribed distance X1 in the horizontal direction from the axial position Y1. A wide fixed part 16a is formed approximately at the middle of the intermediate portion 16. Due to the interposition of inclined part 18, the second terminal portion 20 for connecting to the substrate is displaced by a prescribed distance X2 in a horizontal direction from the axial position Y2 of intermediate portion 16.

For each of contacts 30-1 through 30-5 of the first set shown in FIG. 1, the horizontal distance X1 from the axial position Y1 of terminal portion 12 to the axial position Y2 of the intermediate portion 16 is the same; however, the horizontal distance X2 between the axial position Y2 of intermediate portion 16 and the axial position Y3 of the second terminal portion 20 of the several contacts is varied in order to provide a uniform pitch P2 of the second terminal portions 20 of the contacts for connection to the substrate.

Pitch P2 corresponds to the pitch of the through-holes of the substrate; for example, 1.00 millimeter.

Pitch P1 of the first set of contacts corresponds to the pitch of the solder balls of a BGA package. By way of example, pitch P1 can be 0.65 mm, 0.5 mm or can be made smaller, if desired. Pitch P1 of the second set of contacts is equal to pitch P1 of the first set of contacts. In other words, respective terminal portions 12 of the first and the second sets are aligned in the direction of stacking, i.e., one on top of the other.

Like the first set of contacts, the second set of contacts 40 is such that the horizontal distance X2 from the axial position Y2 of the intermediate portion 16 to the axial position Y3 of the second terminal portion 20 is made variable so that pitch P2 is uniform.

In view of the fact that the second set of contacts 40 is arranged in a direction 180 degrees different from the first set of contacts 30, the second terminal portions 20 of the second set of contacts 40 is symmetrical with the second terminal portions 20 of the first set of contacts 30 relative to a median line C. In other words, all of the second terminal portions 20 of the first set of contacts are arranged in a row or range which is on the left side of the median line C as seen in FIG. 1 and all of the second terminal portions 20 of the second set of contacts are arranged in a range which is on the right side of median line C.

Figure 3A:
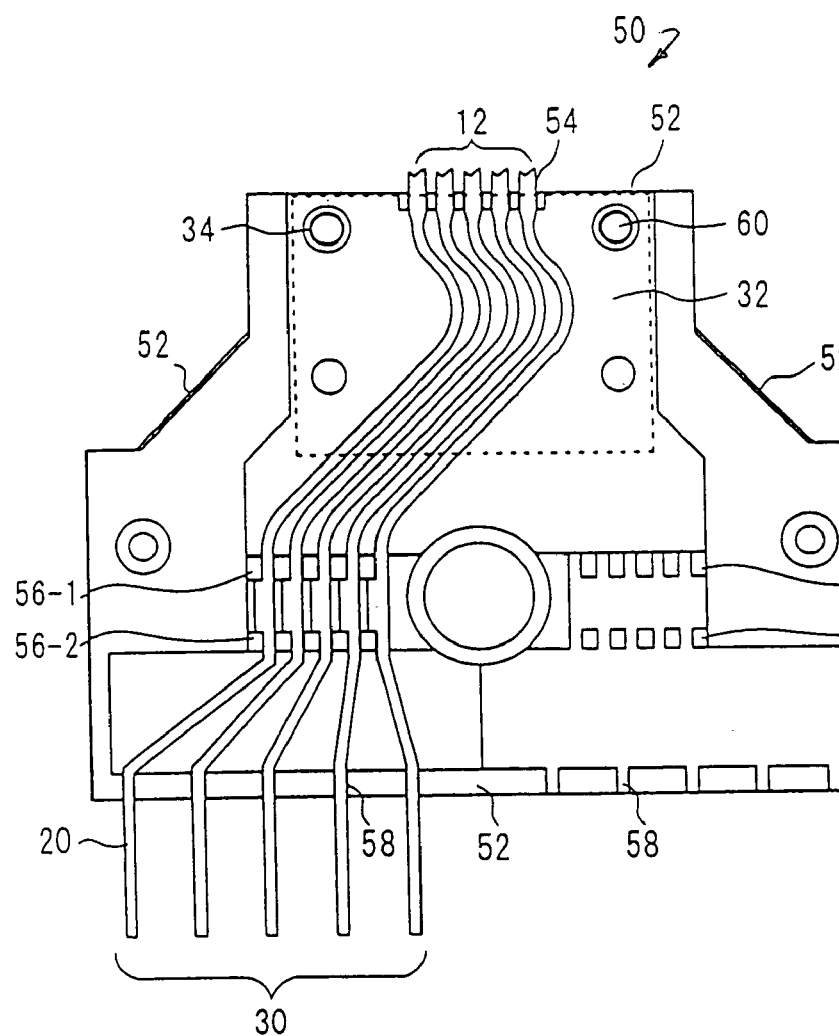
FIG. 3(a) is a plan view showing a first set of contacts installed in a separator and FIG. 3(b) is a cross section of FIG. 3(a) shown with the first and second sets of contacts installed in the separator.
Figure 3B:
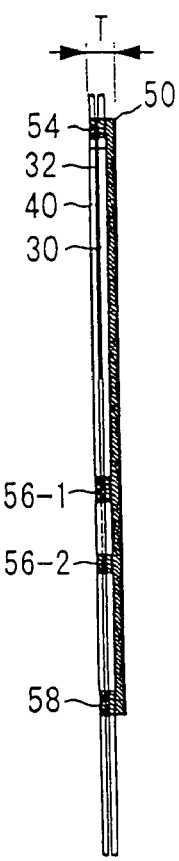

FIG. 3(a) is a plan view showing a separator 50 in which the first set of contacts is accommodated. FIG. 3(b) is a rough cross sectional view showing a separator in which the first and second sets of contacts are accommodated.

Separator 50 is a generally plate-shaped member formed by molding a thermoplastic resin such as, for instance, polyether sulfone (PES). A side wall 52 is formed on its outer periphery. Five openings 54 are formed in wall 52 at the upper end of separator 50. Terminal portions 12 of the first and second sets of contacts are inserted through openings 54 and positioned there.

When a terminal portion 12 engages a respective solder ball, the terminal portion is guided toward opening 54 due to the bending of the elastic deformable portion. The pitch of openings 54 is equal to pitch P1 of terminal portions 12 of the first and second sets of contacts 30 and 40.

A plurality of rectangular protrusions 56-1 and 56-2 are formed approximately at the center of separator 50 and two rows of ten of these are arranged in the horizontal direction. Protrusions 56-1 and 56-2 on the left half side are for positioning and fixing the intermediate portion 16 of the first set of contacts 30 and protrusions 56-1 and 56-2 on the right half side is for the purpose of fixing and positioning the intermediate portion 16 of the second set of contacts 40 not shown in FIG. 3(a).

The distance between the rows of protrusions 56-1 and 56-2 is approximately equal to the length in the axial direction of the fixed part 16a of intermediate portion 16. A respective fixed part 16a is inserted between them.

Second terminal portions 20 are received through 10 openings 58 formed in wall 52 at the lower portion of the separator. The pitch of openings 58 is the same as the pitch P2 of second terminal portions 20.

As shown in FIG. 3(a), the first set of contacts 30 (contacts 30-1 through 30-5) are positioned and installed on separator 50. At this juncture, terminal portions 12 of the first set of contacts protrude from the openings 54 by a prescribed distance and, moreover, second terminal portions 20 protrude from openings 58 on the left half side of the separator.

Next, insulating sheet 32 shown by a dashed line in FIG. 3(a) is placed on the first set of contacts 30. Preferably, an opening 34 is formed at each of the four corners of insulating sheet 32. Insulating sheet 32 is properly positioned by inserting round protrusions 60 formed on separator 50 through respective openings 34. Then the second set of contacts 40 are installed in separator 50. The fixed parts 16a of the second set of contacts 40 are engaged with respective protrusions 56-1 and 56-2. In addition, terminal portion 12 protrudes by a certain fixed distance from upper openings 54 and terminal portions 20 protrude from lower openings 58 on the right half side of the separator.

In this manner, the first and second sets of contacts 30 and 40 which have been electrically insulated from each other by means of insulating sheet 32 are installed in one separator 50. By stacking a plurality of separators 50, one on top of another, the contact assembly is completed. The stacked plurality of separators can be fixed by means of appropriate structure. For example, external wall 52 of separator 50 can be engaged in a hole formed on a separator 50 that is to be stacked on top of same. The separator that has been stacked at the end preferably would be covered by means of an insulating sheet or an insulating plate to prevent exposure of the second set of contacts in the outermost separator.

It will be noted that the pitch of the terminal portions 12 of each set is P1; however, the spacing between respective terminal portions 12 of the first and second sets of contacts 30 and 40 in a single separator can be adjusted by the thickness of the insulating sheet 32.

In the event that a Kelvin technique connection is to be employed, the thickness of the insulating sheet is selected so that the two terminal portions 12 of a respective pair can be accommodated within the outer diameter of a respective solder ball. By setting the thickness of the separator 50 (reference should be made to FIG. 3(b)) at an appropriate thickness T, moreover, the pitch of the terminal portions 12 in the stacking direction is determined.

FIG. 4(a) is a schematic view to facilitate the explanation of the operation of the contact assembly according to this embodiment. Contact 30-5 on the extreme right among the first set of contacts 30 and the contact 40-5 on the extreme left among the second set of contacts 40 are shown as representative contacts.

Contact assembly 100 is installed in an opening formed in a socket. At this juncture, terminal portions 12 of the contacts protrude from the package-seating surface 110 of the socket. It is pointed out in this connection that terminal portions 12 are arranged in conformity with the pitch of the solder balls 130 of the BGA package 120 with which they are used.

If BGA package 120 is pressed down in a perpendicular direction toward package-seating surface 110, there will be engagement between a solder ball 130 and a corresponding terminal portion 12. FIG. 4(b) shows a view taken from a direction that crosses FIG. 4(a) at a right angle where a terminal portion 12 of the first and second sets of contacts engage one solder ball 130. Along with the lowering of the BGA package, portions 12 of the first and second sets of contacts are displaced downwardly by the deformation of the elastic deformable portions 14. The first set of contacts 30 are depressed in such a fashion as to move toward the arc side of the elastic deformable portion 14 and the second set of contacts 40 also are depressed in the same manner as to move toward the arc side of the elastic deformable portion 14.

At this juncture, the slope 22a of groove 22 of terminal portion 12 helps prevent loss of engagement between the solder ball 130 and terminal portion 12 due to the extended surface 22a on the falling side. In addition, the solder ball 130 is wiped by the tilted surface 22a, thereby improving contact stability.

FIG. 4(c) shows the state in which the terminal portions of the representative pair of first and second sets of contacts engage a solder ball 130 as viewed from the front. The effective groove 24 shown by a dashed line when terminal portions 12 of the first and the second set of contacts overlap provide a linear symmetry relative to the center line of the contact portion, with a concave surface being formed at its center, with a result that solder ball 130 is induced into groove 24 for centering.

By using the first set of contacts 30 for the supply of electric power and the second set of contacts 40 for the detection of signals, a Kelvin technique connection with solder balls 130 can be effected. In this case, as seen in FIG. 1, the second terminal portions 20 of the first set of contacts 30 are all arranged on the left side of the median line and the second terminal portions 20 of the second set of contacts are all arranged on the right side of the median line, thereby making it easier to design the socket and the substrate.

Figure 5A:
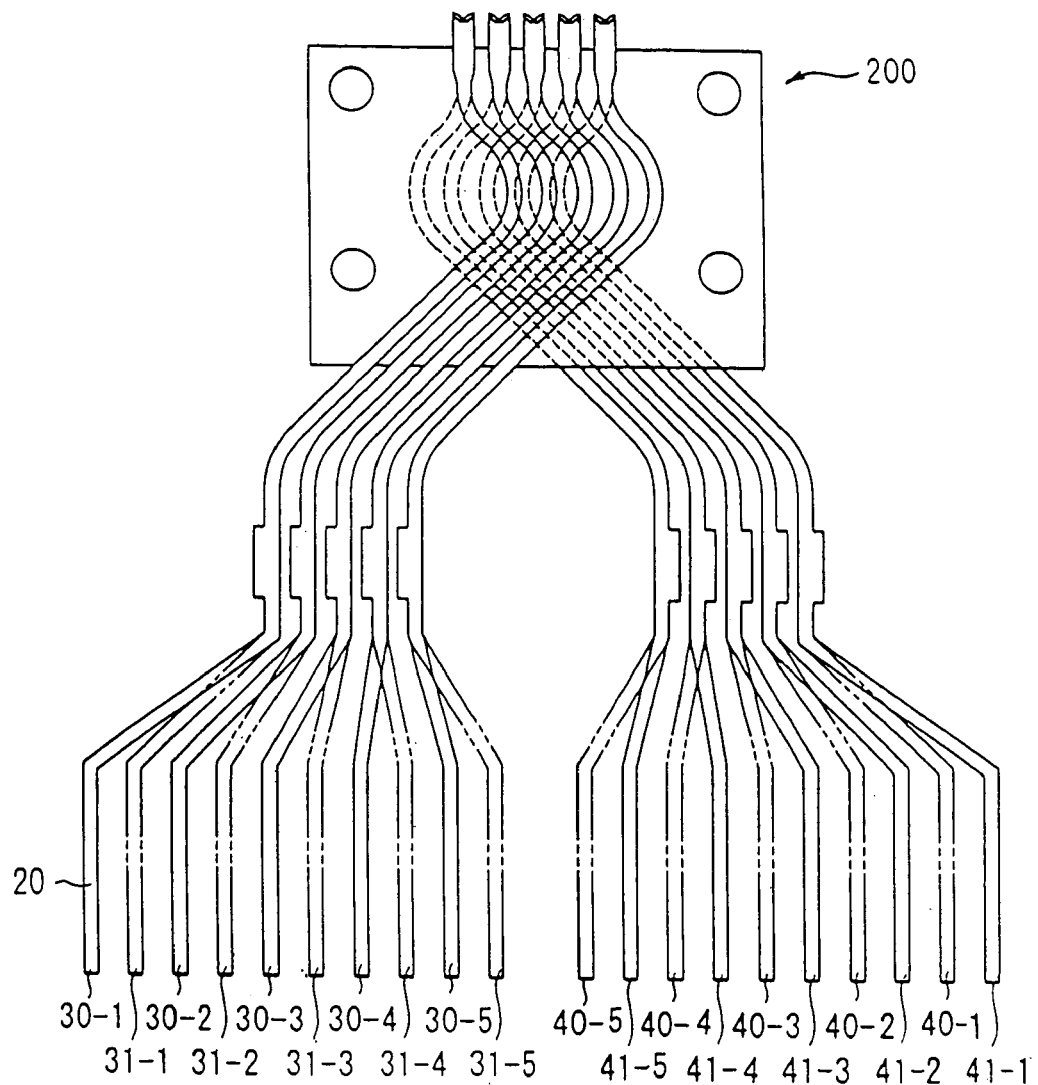
FIG. 5(a) is a plan view showing a contact assembly made according to a second preferred embodiment of the invention and FIG. 5(b) is a schematic view showing the layout of holes in a substrate for receiving the second terminal portions of the FIG. 5(a) assembly.
Figure 5B:
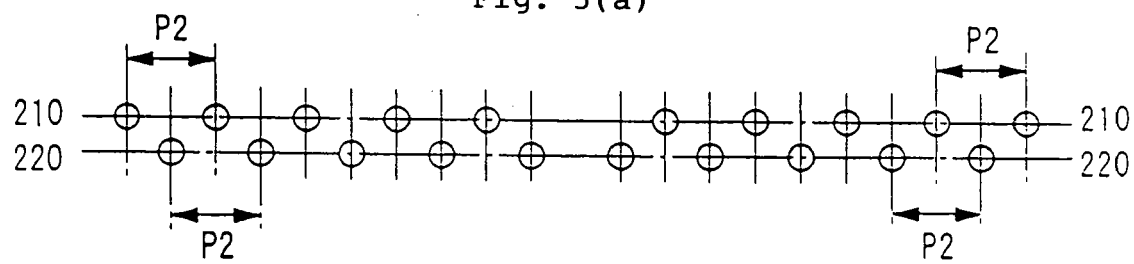

With reference to FIGS. 5(a) and 5(b), a contact assembly made according to a second preferred embodiment of the invention will be described. In the first embodiment, pitch P2 of the second terminal portions 20 was made greater than pitch P1 of the contact portion 12. However, this pitch expansion was only along a single row. In the second embodiment, however, the pitch in the direction in which the second terminal portions are stacked is also expanded.

As shown in FIG. 5(a), contact assembly 200 comprises the first set of contacts 30-1 through 30-5 that are accommodated inside a first separator and the first set of contacts 31-1 through 31-5 that are accommodated inside a second separator and are shifted in the horizontal direction by a half pitch (P2/2). Likewise, the second set of contacts 41-5 through 41-1 of the second separator which are to be stacked on the second set of contacts 40-5 through 40-1 in the first separator are shifted in the horizontal direction by a half pitch.

Thus, respective second terminal portions 20 of the first and second sets of contacts 31-1 through 31-5 and 41-5 through 41-1 are disposed in a row and are centered between adjacent terminal portions 20 of the first and second sets of contacts 30-1 through 30-5 and 40-5 through 40-1 in a spaced apart row forming a zigzag arrangement along two rows.

FIG. 5(b) shows the pattern of the through-holes in the substrate that connect the second terminal portions 20. Through-holes 210 in the first row in the horizontal direction are arranged at a pitch P2, and through-holes 220 in the second row are arranged at a pitch P2 that is shifted by a half pitch. Because of this, the pitch in the direction where the second terminal portions 200 are stacked on the vertical direction of the through-holes 210 and 220 is also expanded.

Next, a third preferred embodiment of the invention will be described. In the first and second embodiments, an example is shown where the pitch P2 in the in-surface direction of the second terminal portions 20 was expanded more than the pitch P1 in the in-surface direction of the first terminal portion 12 of the first set of contacts 30 and the second set of contacts 40. In the third preferred embodiment, however, pitch P1 and pitch P2 are made equal to each other. In the case where the pitch of the solder balls of the BGA package happens to be comparatively large, for example, there is no reason why pitch P2 should be expanded and it can be equal to pitch P1.

Figure 6:
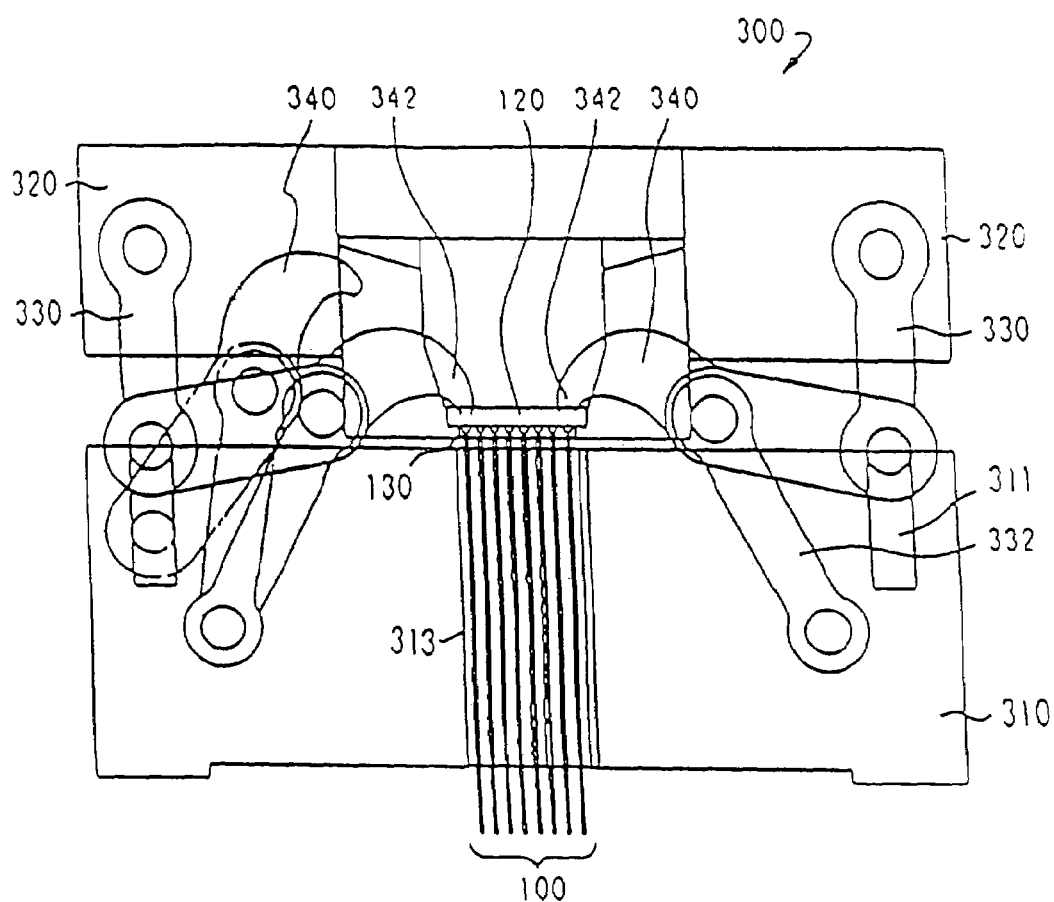
FIG. 6 is a front elevational schematic view showing a socket employing a contact assembly made according to the invention.

With reference to FIG. 6, a socket in which a contact assembly made according to the embodiments of the invention has been installed will be described. However, this socket is illustrative and various prior art sockets, such as those of the prior art discussed above, can be used.

Socket 300 has a base member 310 and a cover member 320 installed to engage in an alternating motion toward and away from base member 310. An opening is formed at the center of base member 310 with the contact assembly according to the first or the second embodiments being accommodated in the opening.

When BGA package 120 is to be inserted, cover member 320 is pushed down toward base member 310. When cover member 320 is depressed, linking member 330, connected to cover member 320, is also pushed down, with a result that the other end of the linking member 330 moves along groove 311 that has been provided in base member 310, with a result that latch member 340 is moved away from the package seating surface.

Latch member 340 that has been moved by linking member 330 rotates, with tip 342 moving outwardly. When cover member 320 has been pushed down, BGA package 120 is dropped from the top of the socket so that it can be placed on the package seating surface 130. When cover member 320 is moved upward thereafter, linking member 330 also moves upward, with its other end moving latch member 340. Its tip 342 rotates toward the BGA package and tip 342 contacts the upper surface of the BGA package.

As cover member 320 moves further upward, the latch member 340 pushes down the BGA package and the solder balls 130 engage the first terminal portions 12 of the contacts. The contacts bend the elastically deformable portions 14 and electrically connect the first terminal portions 12 and respective solder balls 130 under a certain contact pressure. As the first set and the second sets of contacts are connected to the solder balls, a measurement by means of a Kelvin technique can be effected.

Where a BGA package 120 is to be taken out of the socket, cover member 320 is pushed down as in the case where it is to be mounted, latch member 340 is moved away and the BGA package 120 is removed by a vacuum device or the like.

A plurality of separators that have been stacked up are fixed by means of a fixing structural member as described above or the separators can be fixed by using an adhesive agent. The separators which have been fixed in this manner are accommodated in an opening 313 that has been formed in base member 310.

Figures 7A, 7B:
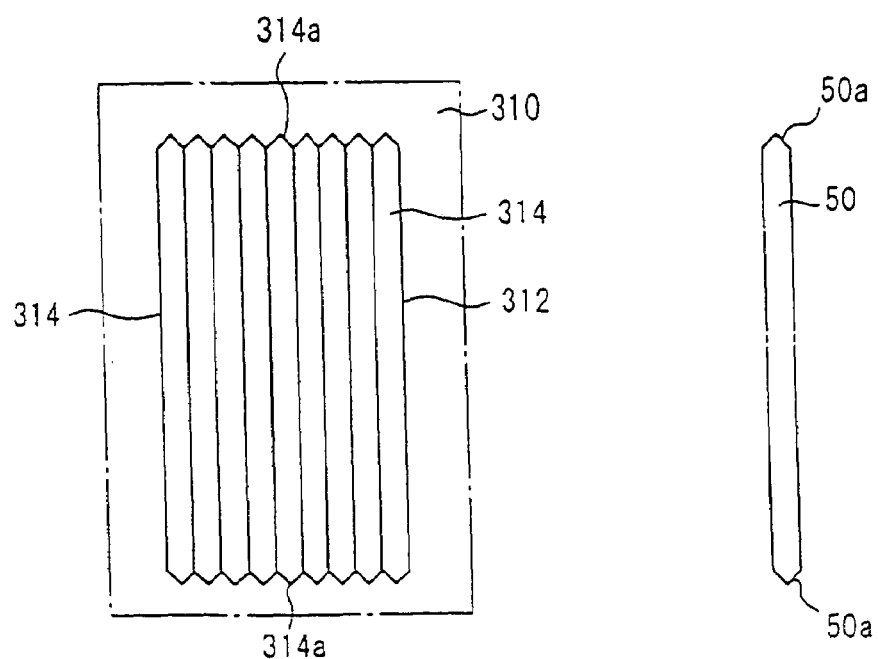
FIG. 7(a) is a top plan view of a portion of a socket base showing slits formed in the base member for receiving contact assemblies and FIG. 7(b) is a contact mounting separator adapted for receipt in one of the slits of FIG. 7(a)

A desirable method for the installation of the contact assembly will be described. FIG. 7(*a*) is a top plan view of opening 313 formed in the base member. As shown in the figure, a plurality of slits 314 are formed for positioning and fixing the separators in opening 313 formed approximately at the center of base member 310. Both ends of each slit 314 are made into a V-shape 314*a*. In other words, V-shaped ends 314*a* are arranged in parallel on two opposed sides of opening 313.

In like manner, both ends 50*a* of separator 50 shown in FIG. 7(*b*) are also made into a V-shape so as to fit into a respective slit. In this manner, separators 50 are inserted and positioned, one by one, into slits 314. According to this method, there will be no need to fix the stacked separators by such means as a separate fixing member, etc., thereby making it possible to reduce the number of parts involved.

Figures 8A, 8B, 8C:
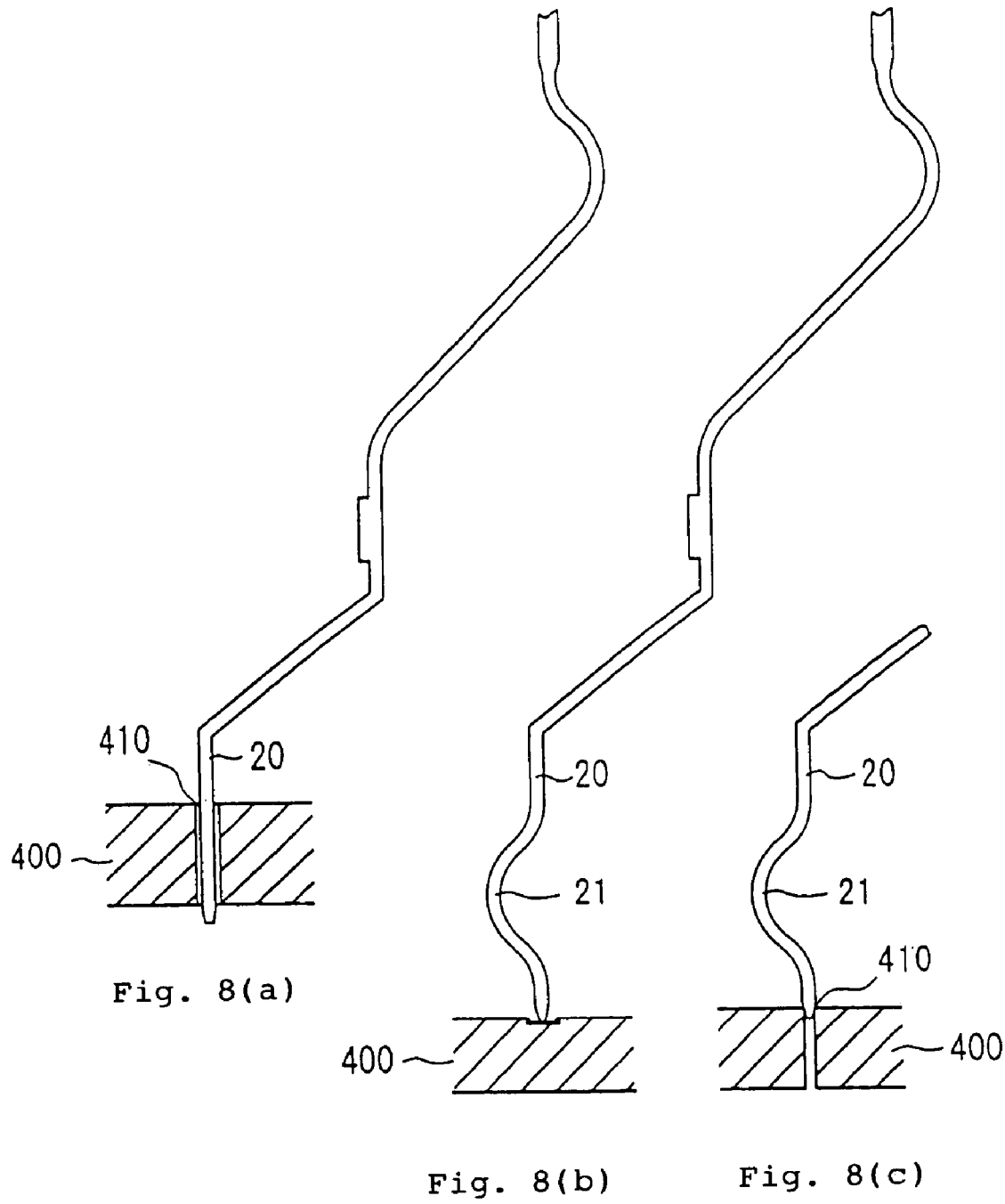
FIGS. 8(a)–8(c) are views showing several examples of contacts and the connection between contacts and a substrate.
Figure 9:
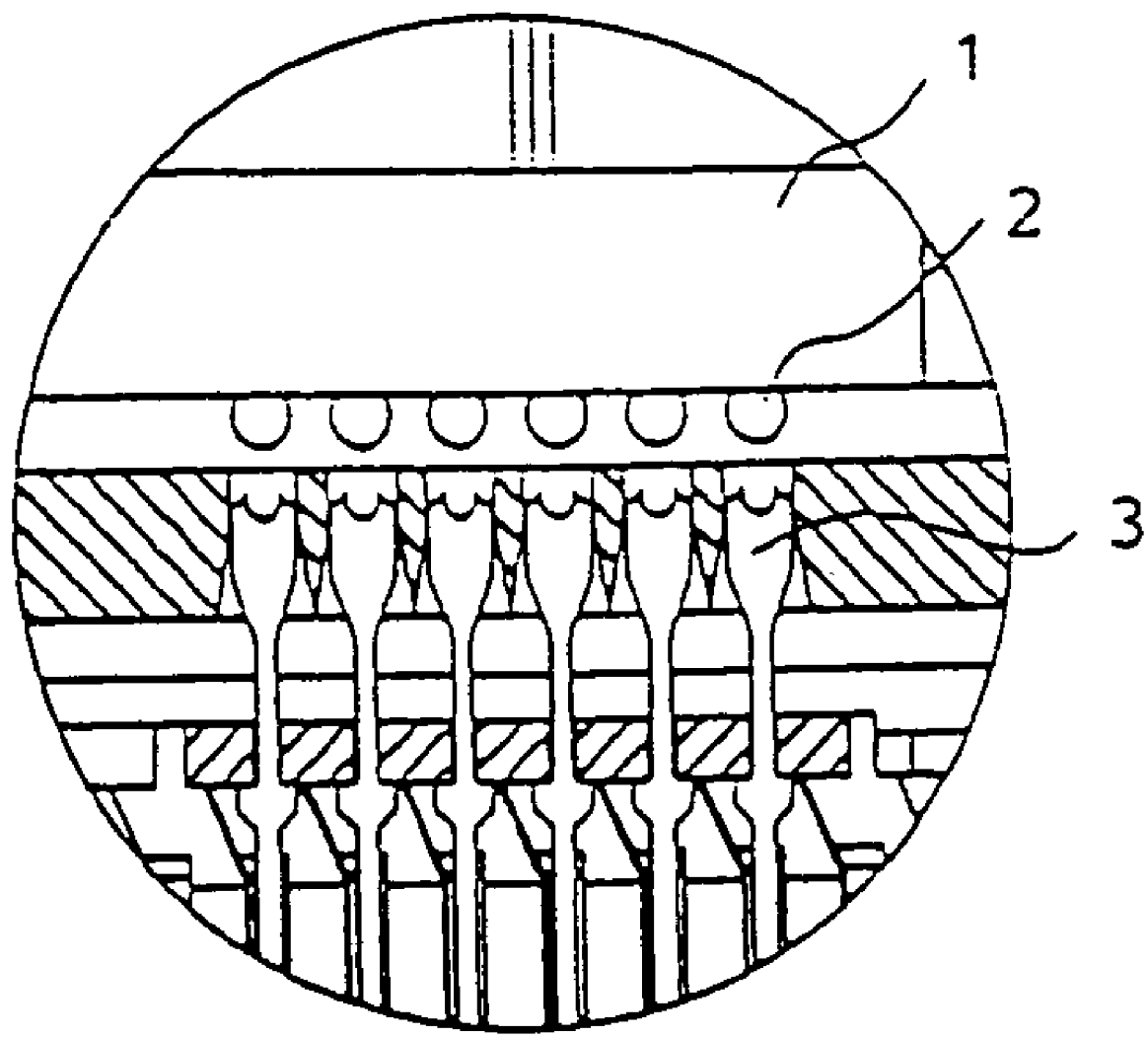
FIG. 9 is a broken away cross sectional view showing the shape of a contact in a conventional socket.

FIGS. 8(*a*)–8(*c*) show examples of a connection between the contacts and the substrate. As is shown in FIG. 8(*a*), the second terminal portion 20 of a contact is inserted into the through-hole 410 formed in substrate 400 to be connected by such means as solder, etc.

If desired, a second elastic deformable portion 21 can be added to the second terminal portion 20 of the contact. As shown in FIG. 8(*b*), for example, it is possible to form an elastically deformable portion 21 that is in the shape of an arc, thereby pressing the second terminal portion 20 against the electrode pad 420 of substrate 400 to provide a compression mount.

In the above case, a jig or the like can be used for fixing the socket to the substrate and form bending the elastically deformable portion 21, thereby exerting a selected pressure on an electrode pad. As shown in FIG. 8(*c*), moreover, the second terminal portion 20 where the elastically deformable portion 21 has been formed may be inserted into the through-hole of the substrate, if desired.

In the above embodiments, a BGA package has been employed as an example. However, the above example can be effectively used in other cases where the LGA and CSP, etc., are involved. Furthermore, it is possible to suitably modify the shape, material or the quantity of the contacts within the range without departing from the scope of the claims.

The contact assembly made according to this invention is intended for use in a socket for semiconductor packages and particularly packages that have narrow-pitch terminals. The sockets may be used for test purposes or for actual mounting purposes as well.

Although the present invention has been described with reference to certain preferred embodiments, it should be appreciated that various other modifications and adaptations can be made without departing from the scope of the invention as defined by the appended claims.

What is claimed is:

1. A contact assembly comprising a plurality of stacked sets of first and second contacts, the first set of contacts being arranged according to a first pattern on a first surface of a sheet and the second set of contacts arranged according to a second pattern on a second surface of the sheet, the first ends of each respective one of the first and second sets of contacts forming a pair and being aligned in the direction of stacking, the second ends of the first set of contacts arranged on one side of a median line of the contact assembly and the second ends of the second set being arranged on the other side of the median line.

2. A contact assembly according to claim 1 in which the set of first contacts has n contacts disposed side by side from 1 to n and the set of second contacts has n contacts disposed side by side from n to 1.

3. A contact assembly according to claim 1 in which the contacts have first and second ends and the first and second ends of the contacts of each set have a selected pitch and the pitch of the second ends is greater than the pitch of the first ends.

4. A contact assembly according to claim 1 in which the contacts have first and second ends and the first and second ends of the contacts of each set have a selected pitch and the pitch of the second ends is the same as the pitch of the first ends.

5. A contact assembly according to claim 1 further including an additional first and additional second set of contacts stacked on the first and second sets of contacts, all of the contacts having first and second ends and the second ends of the first and second sets and the second ends of the additional first and additional second sets of contacts are arranged in a zigzag fashion in the direction of stacking alternating the location thereof between two spaced apart ranges.

6. A contact assembly according to claim 1 in which an insulator having opposed face surfaces is interposed between the first and second sets of contacts and the face surfaces serve as the surfaces on which the sets of contacts are arranged.

7. A contact assembly according to claim 1 in which each of the contacts have first and second ends and the first ends of the first and second sets of contacts are arranged to facilitate connection to the terminals of a semiconductor package using a Kelvin technique.

8. A contact assembly according to claim 1 in which the contact assembly further comprises at least one separator, each separator positioning and accommodating first and second sets of contacts and each separator being stacked.

9. A contact assembly according to claim 1 in which each contact comprises a first terminal portion, a first elastically deformable portion connected to the first terminal portion, an intermediate portion offset in a horizontal direction from the axial position of the first terminal portion as it is connected to the first elastically deformable portion and a second terminal portion that has been offset further in the horizontal direction from the axial position of the intermediate portion as it is connected to the intermediate portion.

10. A contact assembly according to claim 9 in which there is formed an engagement part at the intermediate portion of the contact and protrusions are formed on each separator, the said engagement part being engaged to a protrusion on the separator.

11. A contact assembly according to claim 9 in which each separator has openings into which the first ends of the first and second sets of contacts are inserted and positioned.

12. A contact assembly according to claim 9 in which the first terminal portion has one of a V-shape and a U-shaped groove having opposed sloped surfaces and the length of one opposing sloped surface of each groove extends in a given direction and is longer than the other sloped surface of the respective groove.

13. A contact assembly according to claim 12 in which the first elastically deformable portion of each contact is formed with an arc configuration having a convex shape extending in the same said given direction.

14. A contact assembly according to claim 12 in which each contact has a longitudinal axis and each sloped surface of each groove has a free end and one free end extends further along the longitudinal axis of the contact than the other free end of the respective groove.

15. A contact assembly according to claim 12 in which a second elastically deformable portion is formed between the intermediate portion and the second terminal portion of each contact.

16. A contact assembly according claim 1 further comprising a socket in which the contact assembly is received.

17. Apparatus according to claim 16 in which the socket has a base and the second terminal portions of the contact assembly protrude from the base of the socket and the second terminal portions are electrically connected to a substrate.

18. Apparatus according to claim 17 in which the first set of contacts are for supplying electric power and the second set of contacts are for signal measurement.

19. Apparatus according to claim 1 further comprising a socket, an opening formed in the socket, a plurality of slits are formed in the opening and a separator is received in each slit with each separator mounting a contact assembly.

\* \* \* \* \*